US007939133B2

(12) United States Patent
Jia et al.

(10) Patent No.: US 7,939,133 B2
(45) Date of Patent: May 10, 2011

(54) METHOD OF TRANSFERRING PATTERNED NON-DENSELY PACKED INTERFACIAL PARTICLE FILMS ONTO SUBSTRATES

(75) Inventors: Li Jia, Hudson, OH (US); Matthew A. Ray, Westfield, IN (US)

(73) Assignee: The University of Akron, Akron, OH (US)

( * ) Notice: Subject to any disclaimer, the term of this patent is extended or adjusted under 35 U.S.C. 154(b) by 907 days.

(21) Appl. No.: 11/895,401

(22) Filed: Aug. 24, 2007

(65) Prior Publication Data
US 2008/0053951 A1 Mar. 6, 2008

Related U.S. Application Data

(60) Provisional application No. 60/839,592, filed on Aug. 24, 2006.

(51) Int. Cl.
*B05D 1/28* (2006.01)
*B05D 3/10* (2006.01)
(52) U.S. Cl. ...... 427/256; 427/282; 427/337; 427/430.1
(58) Field of Classification Search .......... 427/256, 427/282, 337, 430.1
See application file for complete search history.

(56) References Cited

U.S. PATENT DOCUMENTS 3,485,658 A * 12/1969 Iler .................. 428/328
4,407,695 A * 10/1983 Deckman et al. ........... 216/42
6,284,310 B2 * 9/2001 Picard ................. 427/180
6,818,117 B2 11/2004 Ferguson et al.

OTHER PUBLICATIONS

Tieke, B., et al., Nano-Surface Chemistry, 2002, 213-243.
Lenzmann, L., et al., Thin-Film Micropatterning Using Polymer Microspheres, Chem. Mater, 1994, vol. 6, No. 2, pp. 156-159.
Bardosova, M., et al., Synthetic opals made by the Langmuir-Blodgett method, Thin Solid Films, 2003, 437, pp. 276-279.
Goldenberg, L., et al., Simple Method for the Preparation of Colloidal Particle Monolayers at the Water/Alkane Interface, Langmuir, 2002, 18, 5627-5629.
Denkov, N. D., et al., Mechanism of Formation of Two-Dimensional Crystals from Latex Particles on Substrates, Langmuir, 1992, 8, pp. 3183-3190.
Micheletto, R., et al., A Simple Method for the Production of a Two-Dimensional, Ordered Array of Small Latex Particles, Langmuir, 1995, 11, pp. 3333-3336.
Hurd, A.J., The electrostatic interaction between interfacial colloidal particles, J. Phys. A: Math Gen., 1985, 18, L1055-L1060.
Ghezzi, F., et al., Pattern Formation in Colloidal Monolayers at the Air-Water Interface, Journal of Colloid and Interface Science, 2001, 238, pp. 433-446.
Nikolaides, M.G., et al., Electric-field-induced capillary attraction between like-charged particles at liquid interfaces, Nature, Nov. 2002, vol. 420, pp. 299-301.

(Continued)

*Primary Examiner* — Frederick J Parker
(74) *Attorney, Agent, or Firm* — Daniel J. Schlue; Roetzel & Andress

(57) ABSTRACT

A process for transferring patterned non-densely packed interfacial particle films onto substrates by providing a substrate, modifying the substrate so that it is non-water wetting, providing an interfacial film of charged particles, applying a surface modifying procedure to said particles, and applying the interfacial particle film to the modified substrate to thereby form a patterned non-densely packed film on the substrate.

12 Claims, 4 Drawing Sheets

OTHER PUBLICATIONS

Aveyard, R., et al., Compression and Structure of Monlayers of Charged Latex Particles at Air/Water and Octane/Water Interfaces, Langmuir, 2000, 16, pp. 1969-1979.

Ray, M., et al., Dynamic Self-Assembly of Polymer Colloids to Form Linear Patterns, Langmuir, 2005, 21, pp. 4786-4789.

Stancik, E., et al., Structure and dynamics of particle monolayers at a liquid-liquid interface subjected to shear flow,The Royal Society of Chemistry, 2003, 123, pp. 145-156.

Stancik, E., et al., Dynamic transitions and oscillatory melting of a two-dimensional crystal subjected to shear flow, J. Rheol., 2004, 48(1), pp. 159-173.

Armstrong, A. J., et al., Isothermal-expansion melting of two-dimensional colloidal monolayers on the surface of water, J. Phys.,: Condens. Matter, 1989, pp. 1707-1730.

Binks, B., Particles as surfactants—similarities and differences, Curr. Opin. Colloid Interface Sci., 7007, 7, pp. 21-41.

Moncho-Jorda, A. et al., Role of Long-Range Repulsive Interactions in Two-Dimensional Colloidal Aggregation: Experiments and Simulations, Langmuir, 2002, 18, pp. 9183-9191.

Kralchevsky, P. A., et al., Capillary Forces between Colloidal Particles, Langmuir, 1994, 10, pp. 23-36.

* cited by examiner

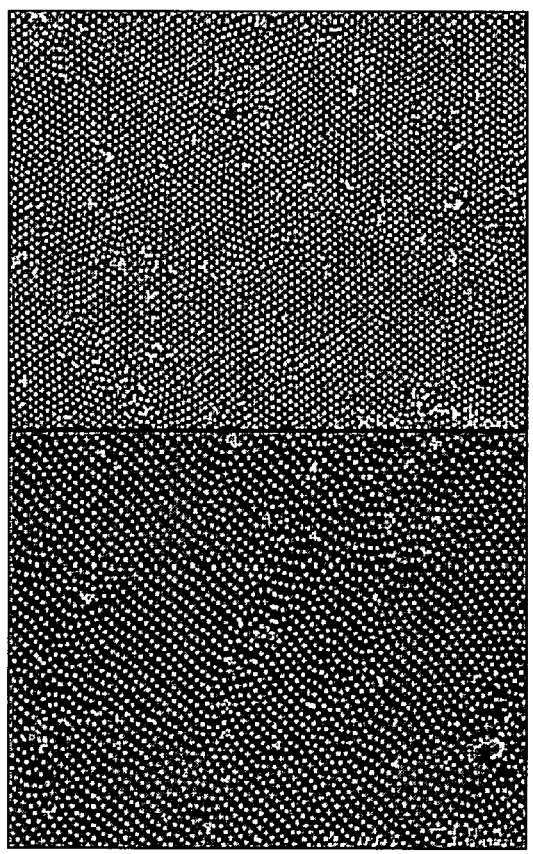
Fig. 1. (a) (Top) and (b) (Bottom)
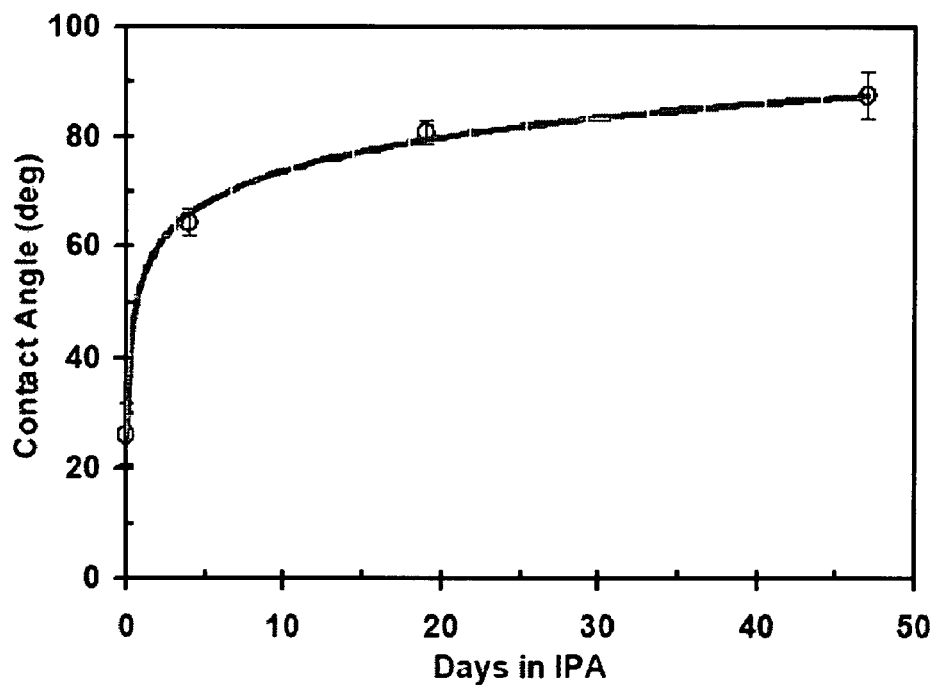
Fig. 2.

* # METHOD OF TRANSFERRING PATTERNED NON-DENSELY PACKED INTERFACIAL PARTICLE FILMS ONTO SUBSTRATES

BACKGROUND OF THE INVENTION

The present invention is directed to a process for transferring self-assembled monolayers onto solid substrates for use as, for example, etching masks.

Particle self-organization at aqueous interfaces has been of scientific interest for several decades. Interfacial self-assemblies at nanometer and micrometer scales can be used to generate micropatterned solid surfaces, which have potential applications in microelectronic and display fabrication, optoelectronic devices, biological microanalysis, etc. Langmuir-Blodgett techniques have been used to deposit hexagonally close-packed (HCP) monolayers of particles formed at aqueous interfaces onto solid substrates. HCP monolayers can also form and be deposited onto substrates during the evaporation of aqueous particle suspensions. Increases in surface pressure or capillary attraction, or both can be responsible for forcing particles to pack in the most spatially economical way during these events.

U.S. Pat. No. 6,818,117 to Ferguson et al discloses a method of preparing self-assembled monolayers on a metal by electrolyzing a thiosulfate compound in a solvent where the electricity for the electrolysis is applied at a voltage for a period of time.

Nanometer- and micrometer-sized charged particles at aqueous interfaces experience long-range Coulombic repulsion and capillary attraction. The interplay of the repulsive and attractive forces results in a variety of self-assembly modes. For example, charged particles at an aqueous interface self-organize into hexagonal arrays directed by long-range electrostatic repulsion and capillary attraction between neighboring particles. Within confined space, large two-dimensional HCP crystals can form, and control of the lattice constant and even distortion from the HCP lattice type can be effected by the variation of the surface pressure. In fact, the ability to adjust the lattice constant to lengths greater than the particle diameter could often be critical for many of the above perceived applications. The transfer and immobilization of two-dimensional sub-monolayer HCP crystals with lattice constants larger than the particle diameter is challenging because the particles are not physically touching each other and can easily be moved out of their lattice positions.

SUMMARY OF THE INVENTION

A process for transferring patterned non-densely packed interfacial particle films onto substrates by providing a substrate, modifying the substrate so that it is non-water wetting, providing an interfacial film of charged particles, applying a surface modifying procedure to said particles, and applying the interfacial particle film to the modified substrate to thereby form a patterned non-densely packed film on the substrate. The pattern can then be transferred subsequently to another surface.

BRIEF DESCRIPTION OF THE DRAWINGS

The foregoing and other features and advantages of the present invention will become apparent to those skilled in the art to which the present invention relates upon reading the following description with reference to the accompanying drawings, in which:

FIG. 1 is an SEM micrograph of a 258 nm particle pattern after being transferred onto SPTCS-modified silicon wafer, with (a) showing the pattern transferred by parallel dipping, while (b) shows the pattern transferred by perpendicular dipping;

FIG. 2 is graph of the change of the particle surface-water contact angle over time after the particle in contact with isopropanol;

DETAILED DESCRIPTION OF THE INVENTION

Figure 3:
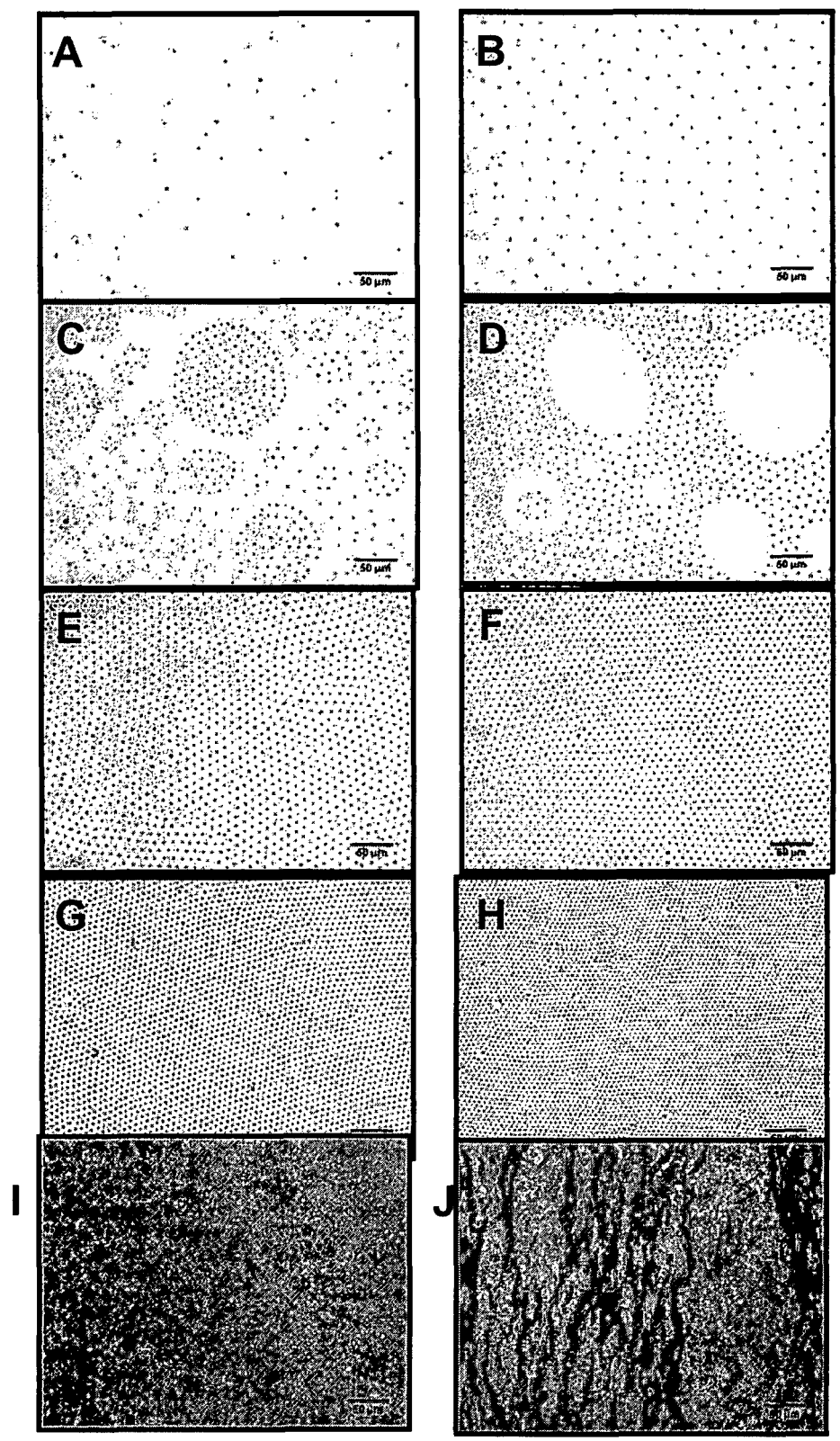
FIG. 3(a)-(j) are optical micrographs of patterns transferred from the air-water interface onto TDAC substrates, where the surface pressures are: (a) 0 mN/m, (b) 0 mN/m, (c) 0.7 mN/m, (d) 5.0 mN/m, (e) 9.0 mN/m, (f) 11.7 mN/m, (g) 14.0 mN/m, (h) 16.4 mN/m, (i) 41.3 mN/m, and (j) 55 mN/m.

A process for transferring patterned non-densely packed interfacial particle films onto, e.g., glass or silicon substrates, by providing a substrate, modifying the substrate so that it is non-water wetting, providing an interfacial film of charged particles, applying a surface modifying procedure to said particles, and applying the interfacial particle film to the modified substrate to thereby form a patterned non-densely packed film on the substrate. The pattern can then be transferred subsequently to the surface topography of a further substrate, such as a silicon substrate by positive or negative etching. The process can be used as part of a process for fabrication of, for example, display, microelectronic, optoelectronic, optical circuitry, antireflective coating, and biological microanalysis devices.

The present invention uses a Langmuir-type method to sequester two-dimensional self-assemblies of charged particles, such as latex particles, at an aqueous interface onto a solid surface with complementary properties to the particle surface. The adhesion characteristics will depend upon the materials employed. Where the adhesion of the particles to the solid substrate after the initial transfer step is not adequate to overcome the destructive capillary forces during the drying process after the transfer, it is preferred to use a "fluid exchange" or "solvent fix" process to secure the two-dimensional crystal to the substrate and thus complete the transfer process. The transferred self-assembled particle arrays can be used for generation of further hierarchical patterns, such as hexagonal arrays of holes, in or on the surface of the solid substrate.

The present invention involves the transfer of patterned sub-monolayer interfacial particle films intact onto substrates, such as polymer, rubber, plastic, metal, stainless steel, glass or silicon substrates, preferably solid surfaces, by tailoring the chemical functionality of the surface to be complementary to that of the polymer particle surface using a surface modifier, such as organosilane self-assembled monolayers (SAMs), in order to promote rapid and strong adhesion with each individual particle when the substrate is brought into contact with the interfacial particle film.

The particles can be nanometer sized and/or micrometer sized particles. The particles can be an organic or polymer composition, such as latex particles, or an inorganic composition, such as silicon oxide, titanium oxide, gallium nitride, gallium arsenide, silicon, or the like. By charging the particles, they will form a non-densely packed interfacial film. For the purposes of this application, the term "interfacial film(s)" is intended to mean a film of particles which forms at the air and fluid, preferably water, interface.

The surface modifying layer provides a transitional layer so that the particles will be functionally complementary with the surface to which they are applied. For the purpose of this application, the term "functionally complementary" is intended to mean that the particles and the substrate both have higher affinity to each other than to water. For example, when the particles are latex particles which are non-wetting to water, i.e., with an infinite water contact angle, the surface modification layer can be an organosilane layer, which renders the substrate also non-wetting to water. The polymer composition is not critical as long as it renders the surface non-wetting and is functionally complementary with the particles. A thin polymer coating can be applied by a solvent cast technique. The thickness of the coating is not critical and will be about 1 nanometer to 10 micrometers, preferably less than 1.0 micrometer. Modifying the surface can provide a surface that is oppositely charged to the particle surface.

Secondary processes may be performed to significantly lower the capillary force during drying and/or to increasing the particle adhesion on the substrate. The secondary processes include a fluid exchange process or solvent fixing process. The solvent fixing method involves choosing a solvent or solvent mixture, such as acetone, and treating the substrate surface after the initial particle film transfer for about 30 seconds so that the order of the array is virtually unchanged while rendering the array resistant to destructive capillary forces. Other solvents that could be employed include acetone, diethyl ether, mixtures of toluene and/or IPA, and the like. The substrate is then rinsed with IPA and allowed to dry. Various degrees of deformation could be achieved by choice of solvents and by changing the time of treatment. By varying the solvent and the immersion time, the degree of particle deformation at the surface is controlled. Variation of the time will result in variances of the shapes and the size of the shapes.

In the fluid exchange process, the substrate covered with a glass cover, between which is the initially transferred particle film still in water, is submerged in ethanol to allow the water to be replaced by the ethanol. Afterwards, the substrate is allowed to dry. The lower capillary force generated by ethanol due to its lower surface tension leaves the pattern nearly undisturbed during the drying process To demonstrate the feasibility of utilizing attractive particle-substrate interactions to transfer the two-dimensional sub-monolayer ordered arrays formed at the aqueous interface onto solid substrates poly(styrene-co-vinylimidazole) latex particles with an average diameter of 258 nm and a zeta-potential of +30 mV were used. This particle system adheres to solid surfaces very well by forming a necking region with the surface. The surfaces of silicon wafer substrates can be functionalized with a SAM of 2-(4-chlorosulfonylphenyl)-ethyltrichlorosilane (SPTCS). The resulting surfaces have a pH 7 buffered water contact angle of 70.5±1.3° (standard deviation, 24 measurements), an ellipsometric thickness of 11.9±1.9 Å (standard deviation, 20 measurements), and a theoretical surface charge density of 64 $\mu C/cm^2$ assuming a complete monolayer formed with a molecular parking area of 25 $Å^2/SO_3$. The conventional method of spreading latex particles in an alcohol suspension at the air-water interface will not work because the latex particles flocculate when exposed to alcohols. By the present process, the latex particles were successfully populated at the interface by vigorously agitating the colloidal suspension and using the particle film created at the surface of the dilute suspension. As seen in FIG. 1(a), when a negatively charged substrate was brought into contact with the air-water interface of the suspension in a parallel geometry, the HCP particle arrays at the interface were successfully transferred to the substrate. As seen in FIG. 1(b), if the substrate is rapidly dipped into the aqueous phase perpendicular to the aqueous surface, the particles were transferred to the substrate in distorted HCP arrays. It is believed that the distortion is likely caused by shear forces acting on the array during the perpendicular dipping process. Either transfer processes can be completed in a few seconds and qualitatively are very reproducible. The complementary electrostatic interaction between the substrate and the particles is important. When a substrate is functionalized by a octadecyltrichlorosilane (OTS) SAM, the particle film still transferred to the substrate, but the pattern was lost due to rearrangement after transfer.

Other particles such as sulfate functionalized polystyrene latex particles with an average diameter of 2.7 µm, a surface charge density of 8.9 $\mu C/cm^2$, and a parking area of 179 $Å^2/SO_4$ can be used. The particles should be highly charged and thus strongly mutually repulsive particles in order to form long-range ordered arrays or crystals. Particles with diameters exceeding 1 µm can be seen using optical microscopy and thus, particle arrays can be directly observed at the air-water interface. For sequestering the particle arrays, the surfaces of silicon wafer substrates will be functionalized by tetradecyldimethyl(3-trimethoxysilylpropyl)ammonium chloride (TDAC) or N-trimethoxysilylpropyl-N,N,N,-tri-n-butylammonium chloride (TBAC) SAMs. The resulting TDAC and TBAC SAMs had pH 7 buffered water contact angles of 77.8±1.9° and 65.6±2.5° (standard deviation, 16 measurements) and ellipsometric thicknesses of 10.4±1.1 Å and 10.2±1.5 Å (standard deviation, 8 and 10 measurements) respectively. The thickness value of the TDAC SAM suggests that the tetradecyl chain lies parallel to the substrate giving the molecule a bent posture at the interface. Assuming full monolayers were indeed achieved and approximating the monolayer parking areas of the TDAC and TBAC SAMs to be 100 and 70 $Å^2/NR_4^+$, the theoretical surface charge densities would be approximately 16 and 23 $\mu C/cm^2$ respectively.

The present invention uses a particle surface modification procedure where the particles are allowed to age by being suspended in isopropyl alcohol (IPA). This alters the surface characteristics of the latex particles favorably for the formation of ordered particle films when spread at the air-water interface. It is known that successfully spreading a latex particle film at an air-water interface can be difficult because the particles tend to submerge into the bulk aqueous phase and are prone to form small aggregates possibility again due to insufficient interparticle repulsion. As seen in FIG. 2, during the time when the latex particles are in contact with IPA, the particle surface-water contact angle after spreading undergoes a progressive increase until approaching an asymptote at ~84°. After the asymptote in contact angle was reached, the particles are readily spread at the air-water interface with minimal particle flocculation and virtually no transfer to the bulk aqueous phase. The spread particles become irreversibly attached to the interface and as a result of the large fraction of the particles surface being above the interface and therefore exempt from the charge screening effects of water, highly ordered long-ranged particle arrays are achieved.

A two-step transfer process can be employed for transferring the ordered interfacial particle films onto solid substrates. In the first step, the positive SAM-modified substrate was steadily lowered parallel to the aqueous surface into contact with the surface film of the highly negatively charged particles. Even though the particles rapidly adhere to the substrate, if the substrate was directly withdrawn from the aqueous surface at this stage, the pattern of the transferred particle film is partially destroyed as the residual water clinging to the substrate de-wets and dries. To circumvent this problem, after contacting the interfacial film, the substrate was lowered further into the aqueous sub-phase. A glass cover slip with dimensions slightly larger than the substrate was floated on top of the water and was allowed to cover the substrate while the substrate was raised out of the liquid. This method protects the transferred particle films and allows them to be observed without the destructive influence of capillary forces. In fact, as seen in FIG. 3, a correlation of transferred patterns with the surface pressure-area isotherm gives a very informative depiction of the phase transitions that occurred at various surface pressures. Further, the process of the ordered array being destroyed upon drying can be observed by optical microscopy when the cover slip is removed. Adjacent particles in the array are squeezed together to form randomly dispersed particle clumps.

Figure 4:
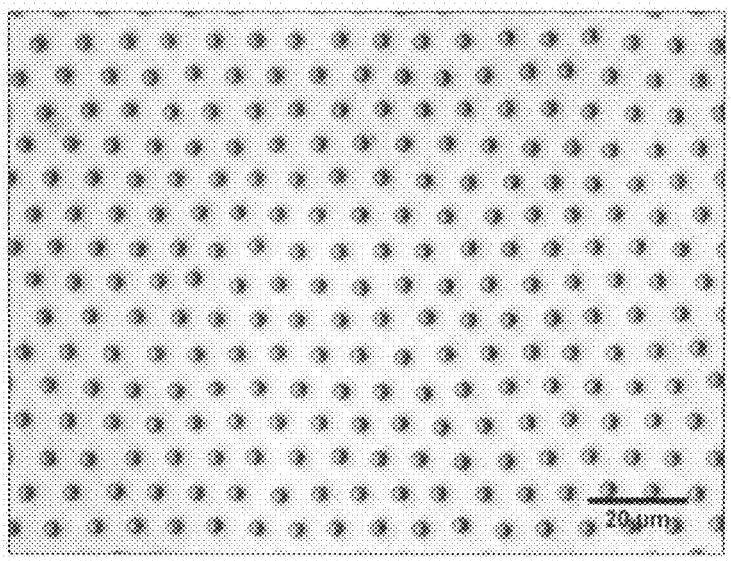
FIG. 4 is an optical micrograph of an 8 μm hexagonal particle pattern of an interfacial film at an air-water interface that was transferred to a TBAC SAM substrate and allowed to dry in air after fluid exchange with ethanol, where the scale bar is 20 μm.
Figure 5:
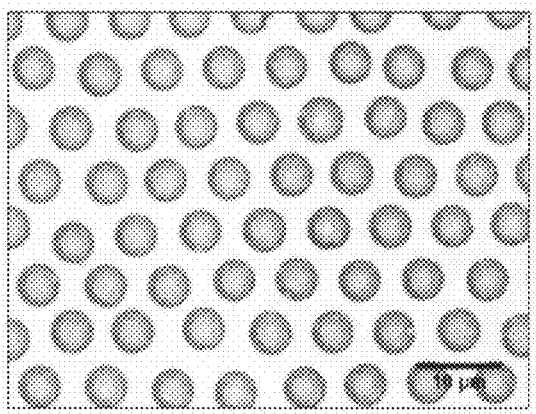
FIG. 5 is an optical micrograph and AFM image of a transferred and solvent fixed 7.3 μm pattern, where the pattern was transferred to a TDAC substrate and then exposed to acetone for 30 s.
Figure 5:
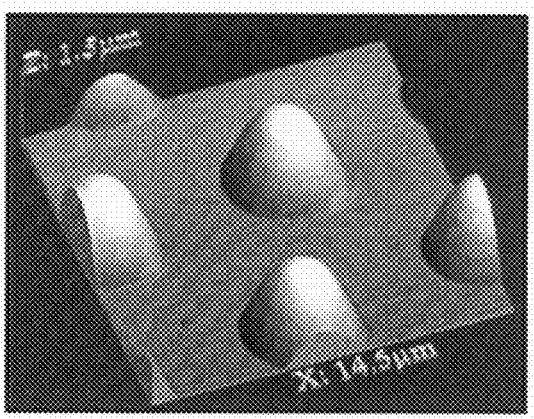
Figure 6:
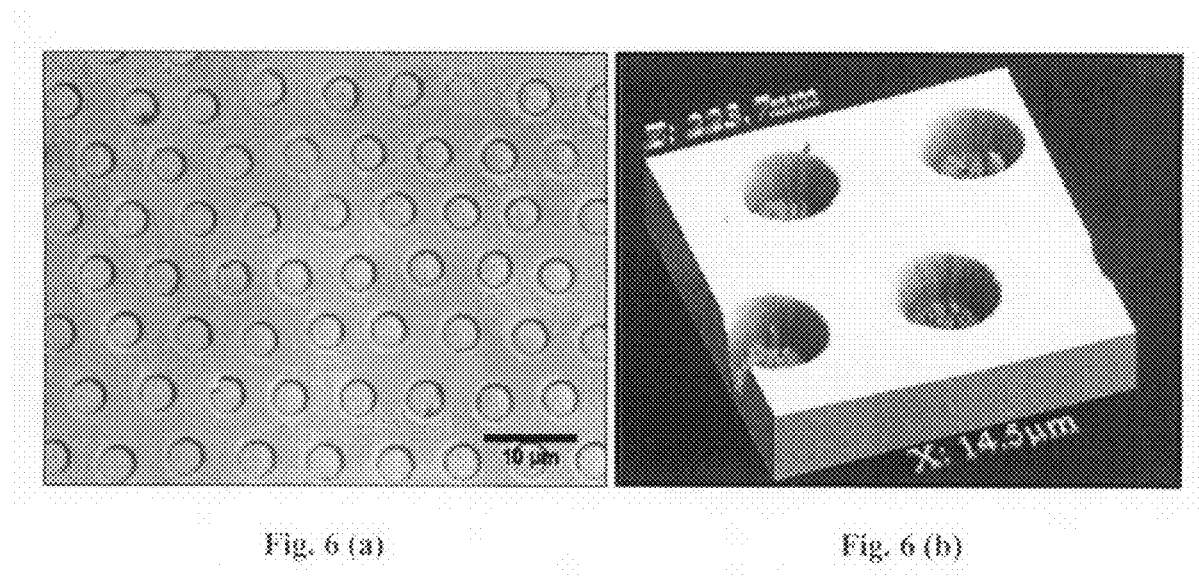
FIG. 6 is an optical micrograph and AFM image of an etched TDAC substrate using a 7.3 μm particle pattern as a mask, where the pattern was transferred to the substrate, exposed to acetone for 30 seconds, and then etched with 20% KOH at 60° C. for 3 min.

As noted, two methods can be used to complete the transfer process, by either significantly lowering the capillary force during drying or by increase the particle adhesion on the substrate. As is seen in FIG. 4, in the fluid exchange process, the cover glass was removed while the substrate is submerged in ethanol. The lower capillary force generated by ethanol due to its lower surface tension leaves the pattern nearly undisturbed during the drying process.

The solvent fixing procedure has an additional benefit. Once the particle has been deformed at the interface, it can function as a lithographic mask. Since the pattern spacing can be controlled as well as the size of the particle-substrate contact circle, the size parameters of the mask can be controlled. The etching procedure causes selective etching where the particles were. It is believed that the TDAC monolayer provides an etch resistant barrier for the silicon substrate. Selective etching could occur if the solvent fixed particles become entangled with the monolayer and disrupt the efficiency of the etch resistance. The polymer dissolves in the basic etchant solution and exposes the compromised SAM to the etchant. At times less than 3 minutes, etching occurs almost exclusively where the particles were creating a patterned array of holes or divots in the substrate. At exposure times longer than 5 minutes, etching seems to occur across the entire surface resulting in slow degradation of the pattern. This experiment is only meant to be a proof of concept. In light of the wide variety of silicon wafer etching techniques available, it is believed that the etching procedure could be performed very selectively and the pattern dimensions could be precisely controlled by optimizing the system.

Suitable Langmuir transfer substrates can be easily prepared with various surface functional groups as a result of the wide variety of organosilicon compounds commercially available or by other techniques such as spin coating. By matching the surfaces of the substrates with complementary surface functionality to that of the particles chosen, such as the use of a silane modification with latex particles, the surface film, rapid adhesion and transfer is achieved with a minimum amount of pattern distortion. The initially transferred array may be subjected to fluid exchange or solvent fixed before drying to prevent disorganization during the drying process caused by lateral capillary forces. The particle array may be used as a mask to transfer the pattern to the surface topography of a substrate using.

EXAMPLE

A 50 mL Langmuir trough with movable barriers was used, although, any device which allows the particles to spread out at the air-water interface can be employed Example 1

Positively charged poly(styrene-co-vinylimidazole) latex particles with an average diameter of 258 nm (Imidazole 258 latex) synthesized by surfactant-free emulsion polymerization were obtained from the Emulsion Polymers Institute. The particles had a narrow PDI of 1.003 and a surface charge density of 20 $\mu C/cm^2$ (measured by conductometric titration), corresponding to an average surface area per single functional group (also known as a parking area) of 80.3 $Å^2/N^+$. The latex was purified by serum exchange and ultracentrifugation. The surface film was generated by rapid agitation of the particle suspension and brought into a desired state by compressing the film with the trough barriers Negatively charged hydrophobic self-assembled monolayers (SAMs) were prepared by allowing clean silicon substrates to react with 2-(4-chlorosulfonylphenyl)-ethyltrichlorosilane (SPTCS), which was purchased from Gelest as a 50 wt % solution in toluene and used as received. The SPTCS stock solution was stored under dry nitrogen, and air-free handling techniques were used because SPTCS rapidly cross-condenses when exposed to moisture. Twenty-five mL of anhydrous toluene and 10 drops of the SPTCS stock solution were placed into a glass Coplin staining jar under a nitrogen purge. Six to eight 25-mm×25-mm square glass or silicon substrates (pre-scored into four 12.5-mm×12.5-mm square sections to reduce handling after functionalization) were then placed vertically into the solution. The top of the jar was covered with parafilm and a slight positive pressure of nitrogen was maintained in the jar. The substrates were allowed to react for 30 min, after which they were sequentially rinsed with toluene, THF, deionized water, and finally blown dry with a nitrogen jet. SAM functionalized substrates were fixed to the end of a 60 mm×3 mm diameter stainless steel dipping rod using double sided tape. The transfer was performed by lowering the substrate in a parallel Langmuir-Schaffer geometry or a vertical Langmuir-Bludget geometry into contact with the surface film and then on into the aqueous bulk phase. The micrographs of the patterned surface of the silicon wafer is shown in FIG. 1. In this example, neither solvent fix nor fluidic exchange were necessary because the adhesion of the transferred particles to the substrate is strong enough.

Example 2

Negatively charged 2.7 µm sulfate functionalized latex particles (Interfacial Dynamics, Inc.) were cleaned by repeated centrifugation cycles in IPA (Pharmco), and finally diluted to 3.00 wt. %. The particles were then aged in the IPA suspension for 20 days. 5 µL to 100 µL of suspension were deposited at a clean air-water (deionized water, Milli-Q) interface with a 100 µL SGE microsyringe at a rate of 5 µl/min via a syringe pump (KD Scientific, model#100). The surface film was brought into a desired state by either compressing the film with the trough barriers or by spreading the desired amount of suspension in a confined area.

TDAC (tetradecyldimethyl(3-trimethoxysilylpropyl)-ammonium chloride) and TBAC (N-trimethoxysilylpropyl-N,N,N,-tri-n-butylammonium chloride) were obtained from Gelest as 50% solutions in methanol and used as received. Substrates were prepared by reacting piranha etched 12.7 or 6.4 mm square silicon wafer (Agere Systems) segments with the trimethoxy silanes at ~1.5 wt. % in methanol at 60° C. for 4 hours or until an asymptote in contact angle was achieved. SAM functionalized substrates were fixed to the end of a 60 mm×3 mm diameter stainless steel dipping rod using double sided tape. The transfer was performed by lowering the substrate in a parallel Langmuir-Schaffer geometry into contact with the surface film and then onto the aqueous phase.

After contacting the interfacial film, the substrate was lowered further into the aqueous sub-phase. A glass cover slip with dimensions slightly larger than the substrate was floated on top of the water and was allowed to cover the substrate while the substrate was raised out of the liquid. At this point, either fluid exchange or solvent fix is performed.

In order to increase the strength of the interaction between each particle and the substrate, a solvent fixing procedure was employed. After removing the substrate covered by a cover slip from the trough, the substrate was placed into a 6 cm watch glass. An appropriate solvent was then placed into the watch glass immersing the substrate. The cover glass was then removed allowing the solvent to come into contact with the patterned array. After 30 seconds, the substrate was rinsed with IPA and allowed to dry. By varying the solvent and immersion time, the degree of particle deformation at the surface is controlled. Other solvents that can be employed are acetone, diethyl ether, and mixtures of toluene and IPA.

After solvent fixing on TDAC SAMs, the pattern can be etched into the silicon wafer substrate. The etchant solution consisted of 20% KOH in a 4:1 solution of DI water and IPA. The etchant solution was heated at 60° C. and patterned solvent fixed substrates were placed in the solution for 3 minutes. The reaction caused bubbling at the surface of the substrate. The substrates were then removed rinsed sequentially with IPA, Toluene, IPA, DI water, and then blown dry with a nitrogen jet.

Although the invention has been described in detail with reference to particular examples and embodiments, the examples and embodiments contained herein are merely illustrative and are not an exhaustive list. Variations and modifications of the present invention will readily occur to those skilled in the art. The present invention includes all such modifications and equivalents. The claims alone are intended to set forth the limits of the present invention.

What we claim is:

1. A process for transferring patterned non-densely packed interfacial particle films onto a substrate comprising:
   A. providing a substrate;
   B. modifying the surface of the substrate to provide a non-wetting surface;
   C. providing an interfacial film of charged particles;
   D. applying a surface modifying procedure to the particles to form an interfacial particle film; and
   E. applying the interfacial particle film to the surface modified substrate to form a patterned non-densely packed film on the substrate.

2. The process of claim 1, wherein the particle film is a charged latex film.

3. The process of claim 1, wherein modifying the surface of the substrate provides a surface oppositely charged to the particle surface.

4. The process of claim 1, wherein the surface modification procedure for the particles involves aging of the particles in contact with an organic liquid.

5. The process of claim 1, wherein the particle film is poly(styrene-co-vinylimidazole) latex particles.

6. The process of claim 1, wherein the substrate is a plastic, rubber, metal, glass or silicon substrate.

7. The process of claim 1, wherein the surface of the substrate is modified using a coating of an organosilane.

8. The process of claim 1, wherein the particles are modified using a coating of an organosilane.

9. The process of claim 1, wherein the surface is modified by a thin coating of polymer.

10. A process for etching a silicon substrate wherein a self-assembled pattern made in accordance with claim 1 is transferred to the surface topography of a substrate.

11. A process for transferring patterned non-densely packed interfacial particle films onto a substrate comprising:
    A. providing a substrate;
    B. modifying the surface of the substrate to provide a non-wetting surface;
    C. providing an interfacial film of charged particles;
    D. applying a surface modifying procedure to the particles to form an interfacial particle film; and
    E. applying the interfacial particle film to the surface modified substrate,
    wherein the coated substrate is further subjected to a solvent fixing process where the coated substrate is exposed to an organic solvent.

12. A process for transferring patterned non-densely packed interfacial particle films onto a substrate comprising:
    A. providing a substrate;
    B. modifying the surface of the substrate to provide a non-wetting surface;
    C. providing an interfacial film of charged particles;
    D. applying a surface modifying procedure to the particles to form an interfacial particle film; and
    E. applying the interfacial particle film to the surface modified substrate,
    wherein the coated substrate is further subjected to a fluid exchange process wherein the coated substrate is exposed to a low surface tension fluid.

* * * * *